(12) United States Patent
Watanabe et al.

(10) Patent No.: US 7,918,403 B2
(45) Date of Patent: Apr. 5, 2011

(54) SEMICONDUCTOR INTEGRATED CIRCUIT DEVICE

(75) Inventors: Kazuki Watanabe, Hino (JP); Ryouji Kanekawa, Takasaki (JP)

(73) Assignee: Renesas Electronics Corporation, Kanagawa (JP)

( * ) Notice: Subject to any disclaimer, the term of this patent is extended or adjusted under 35 U.S.C. 154(b) by 640 days.

(21) Appl. No.: 12/000,851

(22) Filed: Dec. 18, 2007

(65) Prior Publication Data

US 2008/0237354 A1 Oct. 2, 2008

(30) Foreign Application Priority Data

Mar. 30, 2007 (JP) ................................. 2007-090922

(51) Int. Cl.
*G06K 19/06* (2006.01)
(52) U.S. Cl. ........................................ 235/492; 330/278
(58) Field of Classification Search .................. 235/492; 330/278
See application file for complete search history.

(56) References Cited

U.S. PATENT DOCUMENTS

| 7,044,393 B2 * | 5/2006 | Watanabe et al. ............. 235/492 |
| 2006/0038024 A1 | 2/2006 | Nakadai et al. | |

FOREIGN PATENT DOCUMENTS

| JP | 2005-222265 | 2/2004 |
| JP | 2006-060363 | 8/2004 |
| JP | 2006-072678 | 9/2004 |

OTHER PUBLICATIONS

"Information Technology—Telecommunications and Information Exchange Between Systems—Near Field Communication—Interface and Protocol(NFCIP-1)", International Standard, ISO/IEC 14443-2, pp. ii-vi and 1-11.
"Identification Cards—Contactless Integrated Circuit(s) Cards—Proximity Cards", International Standard, ISO/IEC 18092, pp. ii-vi and 1-58.

* cited by examiner

*Primary Examiner* — Thien M. Le
*Assistant Examiner* — Christle I Marshall
(74) *Attorney, Agent, or Firm* — Stites & Harbison PLLC; Juan Carlos A. Marquez, Esq.

(57) ABSTRACT

There are provided an operational amplifier (A1), a capacitor (C1) capable of transmitting an input signal to an inverting input terminal of the operational amplifier, and a feedback path (B11) disposed between an output terminal and the inverting input terminal in the operational amplifier, and a reference voltage is supplied to a non-inverting input terminal. There is provided an input/output stabilizing circuit (B13) for changing a threshold voltage of the operational amplifier, and adding a micro signal input to the inverting input terminal of the operational amplifier, thereby carrying out an input/output stabilizing control in response to a signal output from the operational amplifier. In response to the signal output from the operational amplifier, the threshold voltage of the operational amplifier is changed and the micro signal is added to the signal input to the inverting input terminal of the operational amplifiers so that the input/output stabilizing control is carried out. By the control, the influence of a noise is eliminated and an enhancement in a noise resistance of a receiver circuit is achieved.

11 Claims, 8 Drawing Sheets

SEMICONDUCTOR INTEGRATED CIRCUIT DEVICE

CLAIM OF PRIORITY

The present application claims priority from Japanese application JP 2007-090922 filed on Mar. 30, 2007, the content of which is hereby incorporated by reference into this application.

FIELD OF THE INVENTION

The present invention relates to a semiconductor integrated circuit device, and furthermore, a technique for improving a receiver circuit included therein and an effective technique which is applied to a contactless electronic device such as an IC card.

BACKGROUND OF THE INVENTION

A conventional card having a contactless interface has a large number of types, for example, ISO-18092 introduced in Non-Patent Document 1, ISO14443-B on the ISO standard introduced in Non-Patent Document 2 and a high processing IC card system (which is referred to as a "high-speed type") defined in the Japan IC Card System Application Council (JICSAP). In recent years, there has been demanded a combination card using a plurality of different communicating methods in the contactless interface.

A contactless IC card having a plurality of communicating interface switching functions has been described in Patent Document 2 and Patent Document 3, for example.

The Patent Document 2 has disclosed a technique for detecting a time range of a logical value constituting an information signal transmitted from an external device, thereby discriminating any of a plurality of information transmitting means for transmitting the information signal together with the external device which is used by the external device on a head of the information signal and switching the information transmitting means to prevent a generation of a communication error and an extension of a communication time in a contactless electronic device loading the information transmitting means.

The Patent Document 3 has disclosed a technique for providing a single demodulator circuit capable of demodulating an input signal, a plurality of sampling circuits capable of sampling a signal output from the demodulator circuit synchronously with a predetermined clock signal, a plurality of detector circuits capable of detecting a header for each of signals output from the corresponding sampling circuits respectively, a plurality of processing circuits capable of carrying out a predetermined data processing based on a result of the detection of each of the corresponding detector circuits respectively, and a communication method deciding circuit capable of deciding any of the results of the detection of the header obtained from the detector circuits which is coincident with a preset communicating method, and for executing processings corresponding to a plurality of communicating methods which is different from each other at the same time, thereby shortening a time required for establishing a connection and actually enabling an information transfer.

A so-called IC card loading a semiconductor integrated circuit device and an antenna therein serves to exchange information between an interrogator and the semiconductor integrated circuit device and to implement various functions such as a transmission of data held by the IC card and a hold of data transmitted from the interrogator. The semiconductor integrated circuit device loaded into the IC card receives a high frequency signal supplied from the interrogator through the antenna loaded into a contactless IC card and rectifies and smoothes a voltage generated on both terminals of the antenna, thereby forming an internal voltage which is required for an operation of an internal circuit.

With advanced functions of the IC card, an operating current noise generated by a semiconductor integrated circuit device loaded into an IC card, particularly, a CPU (central processing unit) tends to be increased. The increase in the operating current noise might influence a communication in a contactless interface, thereby causing a false communication.

[Patent Document 1] JP-A-2005-222265 Publication
[Patent Document 2] JP-A-2006-072678 Publication
[Patent Document 3] JP-A-2006-060363 Publication
[Non-Patent Document 1] ISO/IEC-18092 212 kbps and 424 kbp
[Non-Patent Document 2] ISO/IEC-14443 Type-B

SUMMARY OF THE INVENTION

In a data transmission from an interrogator to an IC card, that is, a down communication, a so-called ASK (Amplitude Shift Keying) modulating method for changing an amplitude of a high frequency signal is used often as shown in the Non-Patent Document 1 and the Non-Patent Document 2.

Down communicating means described in the Non-Patent Document 1 is information transmitting means using a so-called amplitude modulating method for partially modulating an amplitude of an AC signal having a high frequency through down communication data, and the down communication data are encoded by the Manchester code, and a preamble code and a synchronization code are added to a head of the down communication data.

Down communicating means described in the Non-Patent Document 2 is information transmitting means using a so-called amplitude modulating method for partially modulating an amplitude of an AC signal having a high frequency through down communication data, and the down communication data are encoded by NRZ-L, and SOF is added to a head of the down communication data and EOF is added to a rearmost part thereof.

A receiver circuit has been disclosed in the Patent Document 1 as a conventional example of a receiver circuit loaded into an IC card corresponding to a communication interface utilizing the amplitude modulating method as the down communicating means as disclosed in the Non-Patent Document 1 or the Non-Patent Document 2.

The receiver circuit disclosed in the Patent Document 1 rectifies and smoothes an AC signal generated on both terminals of an antenna loaded into an IC card, and removes an unnecessary frequency component by a filter circuit. A signal output from the filter circuit is input to an inverting input terminal (−) of an operational amplifier through a capacitor, and the operational amplifier and a feedback path detect a changing point of the signal output from the filter circuit, thereby amplifying a data amplitude.

The operational amplifier and the feedback path have the following states (A) and (B) in case of receiving data, and repeat a transition between the two states, thereby amplifying a data amplitude.

(A) A state in which an electric potential of the inverting input terminal (−) of the operational amplifier is higher than that of a non-inverting input terminal (+), it is possible to detect that the data amplitude is reduced, that is, the electric potential of the inverting input terminal (−) is lowered, and it is impossible to detect that the data amplitude is increased, that is, the electric potential of the inverting input terminal (−) is raised.

(B) A state in which the electric potential of the inverting input terminal (−) of the operational amplifier is lower than that of the non-inverting input terminal (+), it is possible to detect that the data amplitude is increased, that is, the electric potential of the inverting input terminal (−) is raised, and it is impossible to detect that the data amplitude is reduced, that is, the electric potential of the inverting input terminal (−) is lowered.

There will be considered the case in which the receiver circuit described in the Patent Document 1 is applied to an IC card system utilizing the down communicating means described in the Non-Patent Document 1 and the Non-Patent Document 2.

The down communicating means disclosed in the Non-Patent Document 1 has a feature that a large number of changing points of the signal amplitude are present because a frequency component possessed by data is restricted and the frequency is comparatively high. Furthermore, a preamble code which is meaningless as data is added to a head of the data. Even if a head signal amplitude changing point is not detected, therefore, it is possible to demodulate the down communication data. By the advantage of the encoding in the down communicating means, the receiver circuit according to the Patent Document 1 can accurately detect the changing point and can carry out a stable data demodulation.

On the other hand, in the down communicating means disclosed in the Non-Patent Document 2, the SOF added to a head of an information signal is a very important signal implying the head of the data. For this reason, it is necessary to detect the signal amplitude changing point on the head. In order to implement a stable communication, accordingly, it is necessary to continuously maintain the state of (A), that is, a state in which the receiver circuit can detect a decrease in the amplitude before the down communication data are output from the interrogator.

In the receiver circuit, an output voltage of the filter circuit holds a constant potential before the interrogator starts the down communication. Therefore, the inverting input terminal (−) of the operational amplifier also maintains a constant potential. In the case in which the state is continuously maintained for a long period of time, a feedback is applied continuously through the feedback path in such a manner that a potential difference between the inverting input terminal and the non-inverting input terminal in the operational amplifier, and a voltage on both terminals of a diode constituting the feedback path is gradually dropped. At this time, there is brought a state in which an impedance of the feedback path in a direction in which a potential relationship between the inverting input terminal (−) and the non-inverting input terminal (+) in the operational amplifier is inverted is very high and a current flowing to the inverting input terminal (−) of the operational amplifier through the feedback path is very small, and the inverting input terminal (−) of the operational amplifier is brought into an unstabler state than a state in which the number of the amplitude changing points of the amplitude modulating signal output from the interrogator is large.

As described above, in some cases in which the state of a receiving standby is maintained for a long period of time, for example, before the start of the down communication, the inverting input terminal (−) of the operational amplifier is brought into an unstable state so that operating noises of the other circuits loaded into the IC card or noises caused by an external factor are apt to be amplified and the operational amplifier cannot maintain the state of (A). Consequently, there is a possibility that the SOF signal described in the Non-Patent Document 2 cannot be detected and the IC card cannot normally demodulate the down communication data.

It is an object of the invention to enhance a noise resistance of the receiver circuit.

It is a further specific object of the invention to provide a receiver circuit capable of stably demodulating a signal subjected to an amplitude modulation and output from an interrogator without changing an output signal due to operating noises of other circuits provided in an IC card and noises generated by the other circuits laded into the IC card or an external factor in a state brought before the down communication from the interrogator to the IC card is started.

The above and other objects and novel features of the invention will be apparent from the description of the specification and the accompanying drawings.

The typical invention disclosed in the application will be briefly described below.

More specifically, there are provided an operational amplifier, a capacitor capable of transmitting an input signal to an inverting input terminal of the operational amplifier, and a feedback path disposed between an output terminal and the inverting input terminal in the operational amplifier, and a reference voltage is supplied to a non-inverting input terminal. There is provided an input/output stabilizing circuit for changing a threshold voltage of the operational amplifier and adding a micro signal to a signal input to the inverting input terminal of the operational amplifier, thereby carrying out an input/output stabilizing control in response to a signal output from the operational amplifier. In response to the signal output from the operational amplifier, a threshold voltage of the operational amplifier is changed and the micro signal is added to the signal input to the inverting input terminal of the operational amplifier, thereby carrying out the input/output stabilizing control. By the control, the influence of a noise is eliminated to achieve an enhancement in the noise resistance of the receiver circuit.

DETAILED DESCRIPTION OF THE PREFERRED EMBODIMENTS

1. SUMMARY OF THE PREFERRED EMBODIMENTS

First of all, description will be given to the summary of the preferred embodiments according to the invention disclosed in the application. In the description of the summary of the preferred embodiments, the reference numerals of the drawings in parentheses only illustrate elements included in the concept of components having them.

[1] A semiconductor integrated circuit device (B2) according to the preferred embodiments of the invention comprises an operational amplifier (A1) having an inverting input terminal, a non-inverting input terminal and an output terminal, a capacitor (C1) capable of transmitting an input signal to the inverting input terminal of the operational amplifier, and a feedback path (B11) provided between an output terminal and the inverting input terminal in the operational amplifier, and a reference voltage is supplied to the non-inverting input terminal. There is provided an input/output stabilizing circuit (B13) for changing a threshold voltage of the operational amplifier and adding a micro signal to a signal input to the inverting input terminal of the operational amplifier, thereby carrying out an input/output stabilizing control in response to a signal output from the operational amplifier. According to the structure, the input/output stabilizing circuit (B13) changes the threshold voltage of the operational amplifier and adds the micro signal to the signal input to the inverting input terminal of the operational amplifier, thereby carrying out the input/output stabilizing control in response to the signal output from the operational amplifier. By carrying out the control, it is possible to eliminate the influence of a noise, thereby enhancing a noise resistance of a receiver circuit.

[2] In the semiconductor integrated circuit device (B2), moreover, there are provided a threshold voltage control circuit (B13a) capable of controlling a threshold voltage of the operational amplifier and an input signal adding circuit (B13b) for adding an input signal from the inverting input terminal of the operational amplifier. In this case, the threshold voltage of the operational amplifier is dropped by the threshold voltage control circuit and a change in a signal in a positive direction is added to a change in the signal input to the inverting input terminal of the operational amplifier by the input signal adding circuit when an output voltage of the operational amplifier is lower than the reference voltage, and the threshold voltage of the operational amplifier is raised by the threshold voltage control circuit and a change in a signal in a negative direction is added to the change in the signal input to the inverting input terminal of the operational amplifier by the input signal adding circuit when the output voltage of the operational amplifier is higher than the reference voltage. Also in the structure, it is possible to eliminate the influence of the noise, thereby enhancing the noise resistance of the receiver circuit.

[3] The operational amplifier (A1) can be constituted to include a first MOS transistor (M1) and a second MOS transistor (M2) which is differentially connected to the first MOS transistor. At this time, the inverting input terminal is led out of a gate terminal of the first MOS transistor and the non-inverting input terminal is led out of a gate terminal of the second MOS transistor.

[4] The threshold voltage control circuit (B13a) can be constituted to include a third MOS transistor (M9) and a fourth MOS transistor (M10) which is differentially connected to the third MOS transistor. At this time, the reference voltage is transmitted to a gate terminal of the third MOS transistor, the output voltage of the operational amplifier is transmitted to a gate terminal of the fourth MOS transistor, a drain terminal of the third MOS transistor is connected to that of the first MOS transistor, and a drain terminal of the fourth MOS transistor is connected to that of the second MOS transistor.

[5] The input signal adding circuit (B13b) can be constituted to include a binarize circuit (B15) for comparing the output voltage of the operational amplifier with the reference voltage, thereby carrying out a binarization, and a signal supplying circuit (M11, M12) capable of supplying a micro signal to be added to a signal input to the inverting input terminal of the operational amplifier by connecting a fifth MOS transistor (M11) connected to a first current source to a six MOS transistor (M12) connected to a second current source in series and selectively conducting the fifth MOS transistor to the sixth MOS transistor in response to a signal output from the binarize circuit.

[6] When a binarize circuit for binarizing a signal output from the operational amplifier is disposed (B12) in a subsequent stage of the operational amplifier (A1), it is possible to utilize the binarize circuit in the input signal adding circuit. More specifically, the input signal adding circuit can be constituted to include a signal supplying circuit (M11, M12) capable of supplying a micro signal to be added to a signal input to the inverting input terminal of the operational amplifier by connecting a fifth MOS transistor (M11) connected to a first current source to a six MOS transistor (M12) connected to a second current source in series and selectively conducting the fifth MOS transistor to the sixth MOS transistor in response to a signal output from the binarize circuit disposed in the subsequent stage of the operational amplifier.

[7] The input/output stabilizing circuit (B13) can be constituted in the following manner.

There is provided a binarize circuit (B13a) for comparing the output voltage of the operational amplifier with the reference voltage, thereby carrying out a binarization. Moreover, there is provided a threshold voltage control circuit (B13a) capable of controlling the threshold voltage of the operational amplifier by connecting a seventh MOS transistor (M13) connected to a third current source to an eighth MOS transistor (M14) connected to a fourth current source in series and selectively conducting the seventh MOS transistor to the eighth MOS transistor in response to a signal output from the binarize circuit. Furthermore, there is provided a signal supplying circuit (B13b) capable of supplying a micro signal to be added to a signal input to the inverting input terminal of the operational amplifier by connecting a ninth MOS transistor (M11) connected to a fifth current source to a tenth MOS transistor (M12) connected to a sixth current source in series and selectively conducting the ninth MOS transistor to the tenth MOS transistor in response to a signal output from the binarize circuit.

[8] The semiconductor integrated circuit device is loaded into an IC card (B1) and can carry out a processing of receiving a signal output from an interrogator (T4).

2. FURTHER DETAILED DESCRIPTION OF THE PREFERRED EMBODIMENTS

Next, the embodiment will be described in more detail. The best mode for carrying out the invention will be described below in detail with reference to the drawings. In all of the drawings for explaining the best mode for carrying out the invention, members having the same functions have the same reference numerals and repetitive description thereof will be omitted.

Figure 2:
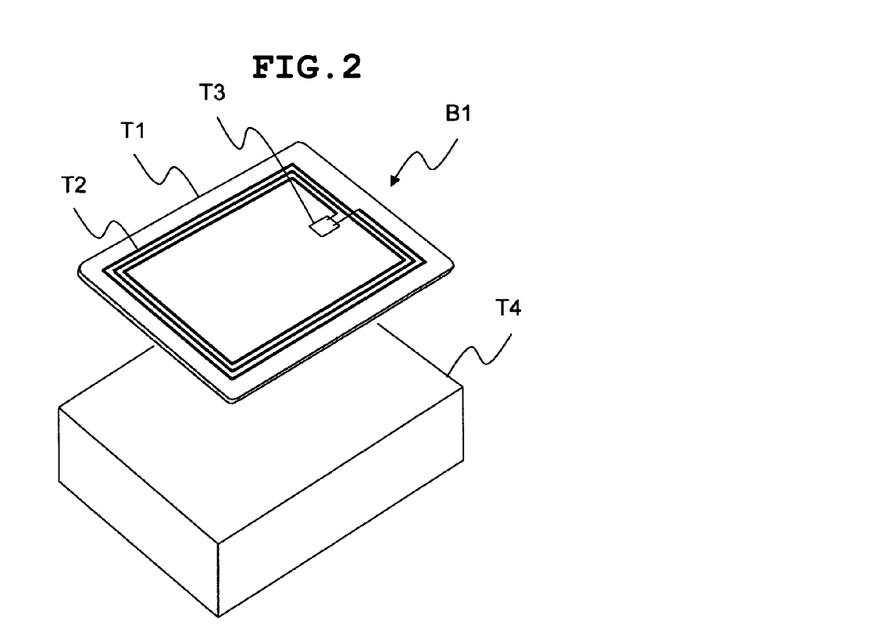
FIG. 2 is a perspective view showing the contactless IC card.

FIG. 2 shows a contactless IC card to which the semiconductor integrated circuit device according to the invention is applied.

A contactless IC card B1 takes a configuration of a card by a printed wiring board T1 subjected to a resin mold. An outside and an input/output terminal are not provided on an IC card surface and a power supply and a signal transfer are carried out through a radio wave. An antenna L0 for receiving an electromagnetic wave from an interrogator T4 disposed on the outside is constituted by a spiral coil T2 formed by a wiring of the printed wiring board T1. A semiconductor integrated circuit device B2 is provided as an IC chip T3 formed on a semiconductor substrate such as a single crystal silicon substrate by a well-known semiconductor integrated circuit manufacturing technique. The IC chip T3 is mounted on the printed wiring board T1. The coil T2 to be the antenna L0 is connected to the IC chip T3.

The antenna L0 receiving the electromagnetic wave from the interrogator T4 outputs an AC signal having a high frequency to antenna terminals LA and LB. The AC signal is modulated partially by an information signal (data).

Figure 1:
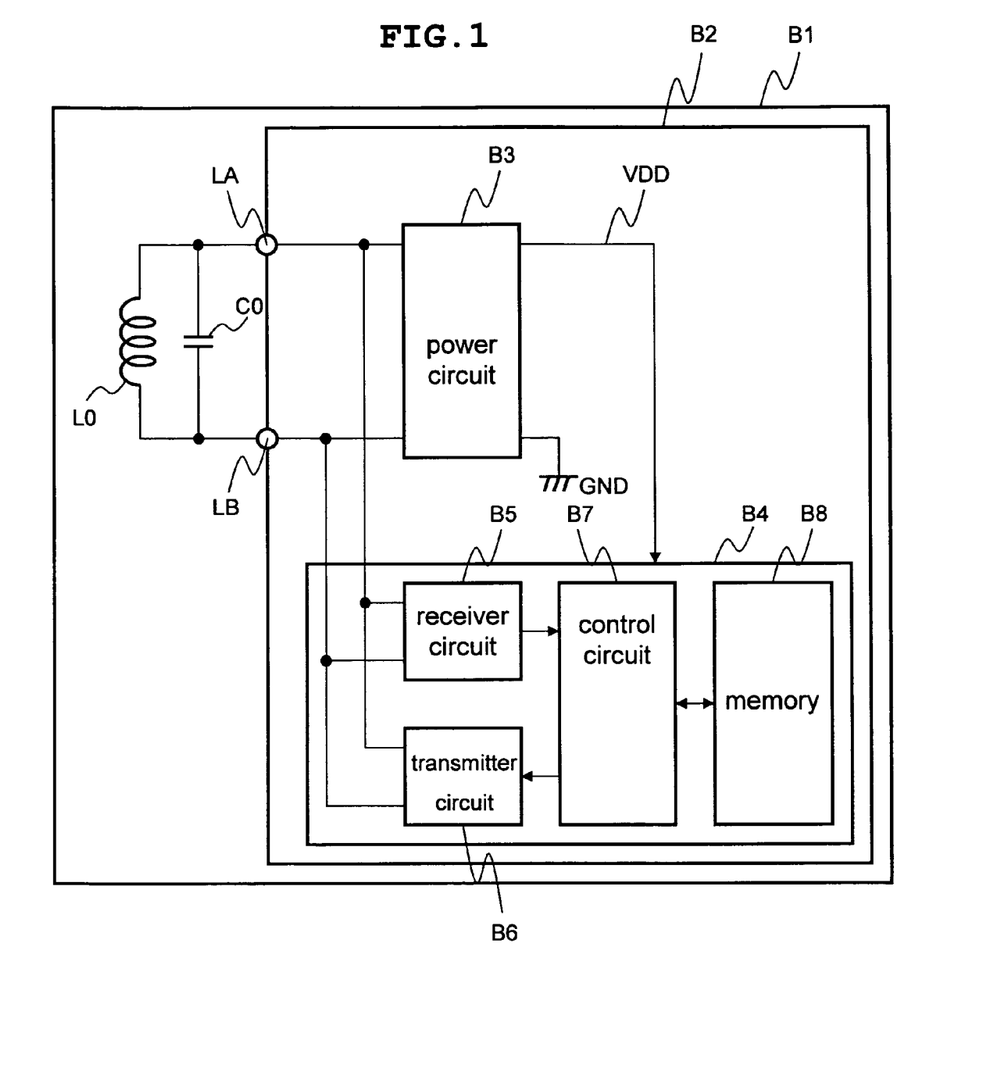
FIG. 1 is a block diagram showing an example of a structure of a contactless IC card to which a semiconductor integrated circuit device according to the invention is applied.

FIG. 1 shows a basic structure of the contactless IC card B1.

In the contactless IC card B1, B2 denotes a semiconductor integrated circuit device, L0 denotes an antenna loaded into the IC card B1, and C0 denotes a resonant capacitor. The semiconductor integrated circuit device B2 has a power circuit B3, an internal circuit B4, and the antenna terminals LA and LB for connecting the antenna L0. While the resonant capacitor CO is loaded into the IC card B1 in FIG. 1, moreover, it may be loaded into the semiconductor integrated circuit device B2.

In FIG. 1, the power circuit B3 is constituted by a rectifying circuit and a smoothing capacitor. The rectifying circuit rectifies and smoothes an AC signal received through the antenna L0 provided in the IC card and obtains a source voltage VDD on a high potential side which is supplied as a source voltage of the internal circuit B4. A ground terminal GND is set to have a low potential side power level. Moreover, it is possible to provide a regulator circuit which serves to control the source voltage VDD so as not to exceed a predetermined voltage level.

The internal circuit B4 is constituted to include a receiver circuit B5, a transmitter circuit B6, a control circuit B7 and a memory B8. The receiver circuit B5 demodulates an information signal superposed on the AC signal received through the antenna L0 provided in the IC card and supplies a digital information signal to the control circuit B7. The transmitter circuit B6 receives the information signal to be the digital signal output from the control circuit B7 and modulates, with the same information signal, the AC signal received through the antenna L0. The interrogator T4 receives the information signal from the control circuit B7 upon receipt of a change in a reflection of an electromagnetic wave sent from the antenna L0 through the modulation.

Figure 3:
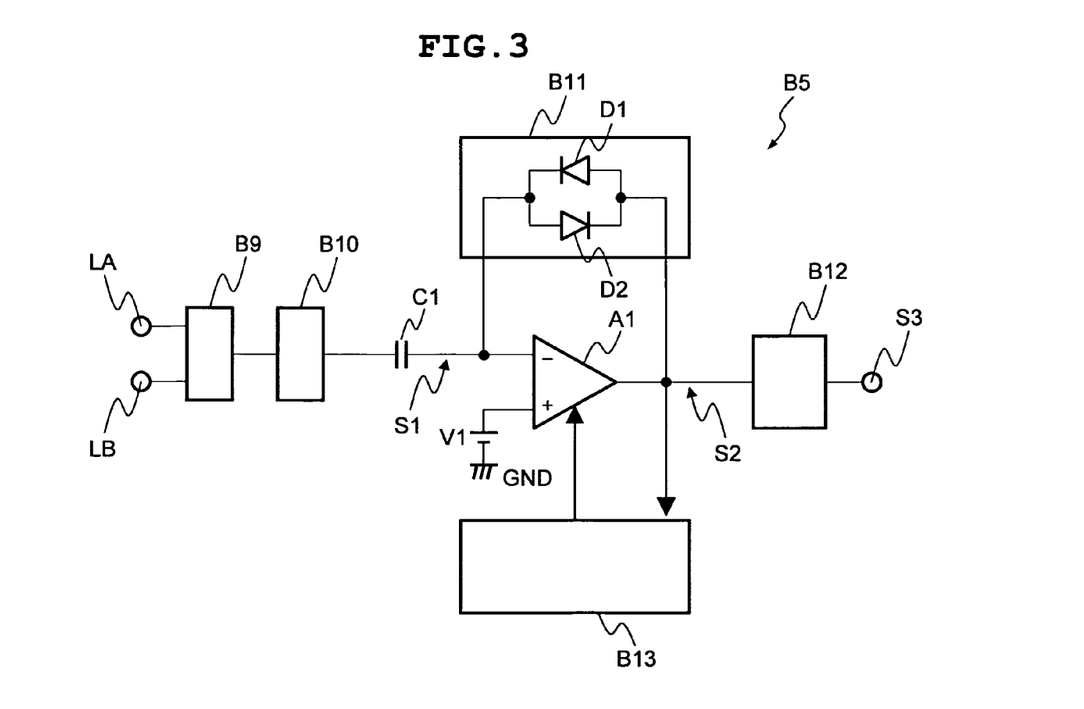
FIG. 3 is a circuit diagram showing an example of a basic structure of a receiver circuit included in the contactless IC card.
Figure 4:
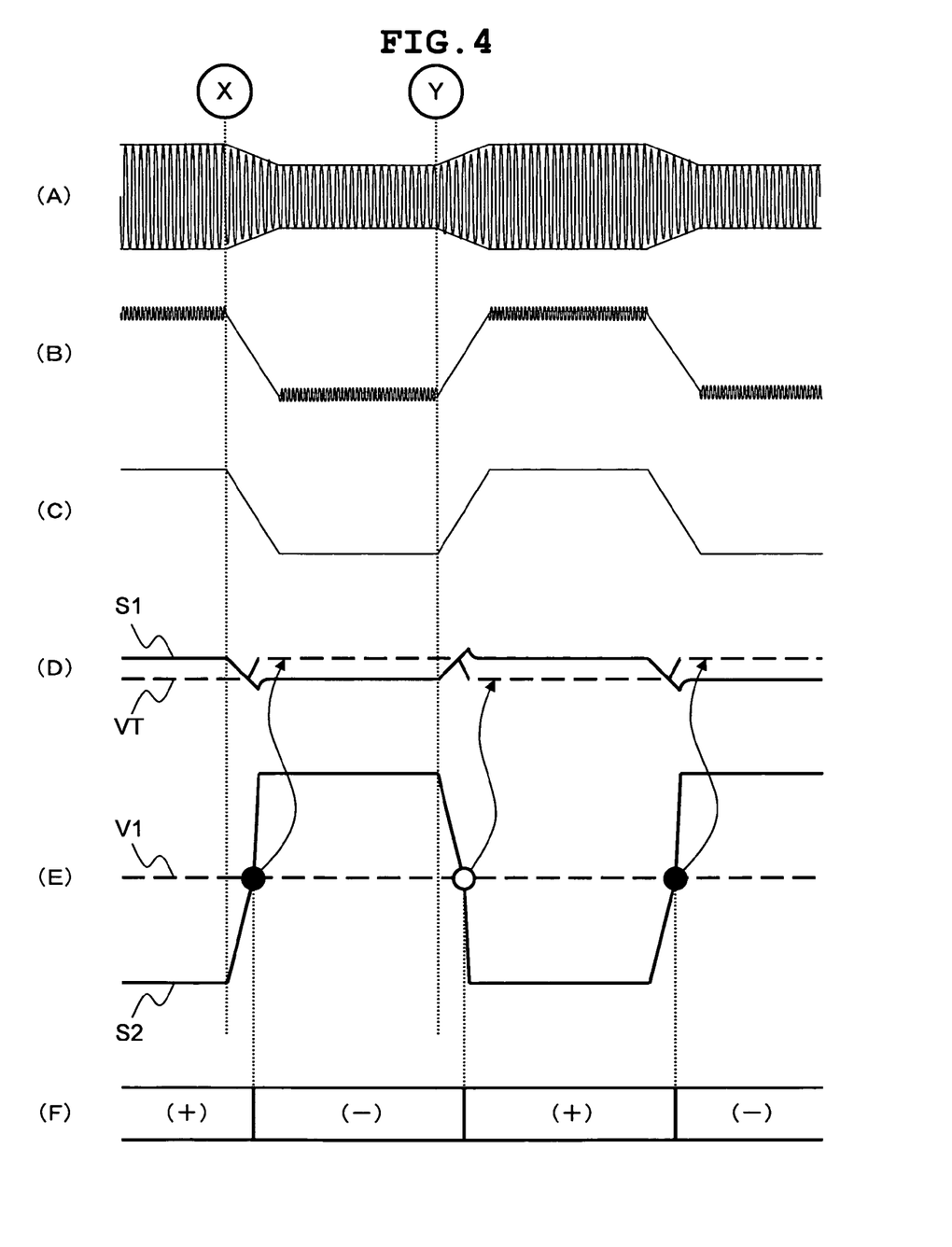
FIG. 4 is a waveform diagram showing an operation of a main part in the receiver circuit.

FIG. 3 is a diagram showing a structure of a basic circuit in the receiver circuit B5. FIG. 4 shows an operating waveform of each portion in the receiver circuit B5 illustrated in FIG. 3. In FIG. 4, (A) represents a voltage between antenna terminals which is generated between the antennal terminals, (B) represents a signal output from a rectifying circuit B9, (C) represents a signal output from a filter circuit B10, (D) represents a signal S1 input to an inverting input terminal (−) of an operational amplifier A1 and an equivalent threshold voltage VT of the operational amplifier A1, (E) represents a reference voltage V1 and a signal S2 output from the operational amplifier A1, and (F) represents a polarity of a micro signal added to the inverting input terminal (−) of the operational amplifier A1.

The receiver circuit B5 shown in FIG. 3 is constituted by the rectifying circuit B9, the filter circuit B10, a capacitor C1, the operational amplifier A1, a feedback path B11, a binarize circuit B12, and an input/output stabilizing circuit B13. A signal generated between the antenna terminals LA and LB is rectified and smoothed by the rectifying circuit B9, an unnecessary frequency component is removed by the filter circuit B10, and the signal is then input to the inverting input terminal (−) of the operational amplifier A1 through the capacitor C1. The reference voltage V1 is input to a non-inverting input terminal (+) of the operational amplifier A1, and the feedback path B11 constituted by diodes D1 and D2 connected in parallel in reverse directions is connected between an output terminal and the inverting input terminal (−) in the operational amplifier A1.

While the rectifying circuit B9 is provided in the receiver circuit B5, it may be shared with a rectifying circuit constituting a power circuit provided in the IC card B1 and a Schottky barrier diode or an MOS transistor described in the Patent Document 1 may be used in the feedback path B11. Since the filter circuit B10 has a main object for removing a high frequency component by a carrier, moreover, it is typically constituted by a lowpass filter and a bandpass filter may be used. In this case, a passband frequency of the filter circuit B10 is set so as not to perfectly remove a frequency band of data.

The binarize circuit B12 compares the output signal S2 of the operational amplifier A1 with the reference voltage and outputs "0" or "1" corresponding to a relationship between magnitudes thereof.

The input/output stabilizing circuit B13 serves to stabilize an input/output voltage of the operational amplifier A1 in response to the output signal S2 of the operational amplifier A1, and has the function of dropping the threshold voltage of the operational amplifier A1 and adding a very small change in a positive direction to a change in the signal input to the inverting input terminal (−) when the output signal S2 of the operational amplifier A1 is lower than a predetermined voltage, and raising the threshold voltage of the operational amplifier A1 and adding a very small change in a negative direction to the change in the signal input to the inverting input terminal (−) when the output signal S2 of the operational amplifier A1 is higher than the predetermined voltage.

Immediately before a changing point X where an amplitude of the high frequency signal output from the interrogator T4 shown in FIG. 4 is reduced, the output signal of the operational amplifier A1 is lower than the predetermined voltage. Therefore, a very small change in the positive direction is added to the inverting input terminal (−). At the changing point X where the amplitude of the high frequency signal output from the interrogator T4 is reduced, accordingly, an inverting operation can be carried out for a larger change in a negative direction than the very small change in the positive direction which is added to the inverting input terminal (−).

Furthermore, the output signal S2 of the operational amplifier A1 is sufficiently lower than the predetermined voltage. Therefore, the equivalent threshold voltage VT of the operational amplifier A1 is maintained to be low by the input/output stabilizing circuit B13. Therefore, the output signal S2 of the operational amplifier A1 is started to be changed slowly with respect to the change in the negative direction of the inverting input terminal (−) after the changing point X.

If the change in the negative direction which is input to the inverting input terminal (−) of the operational amplifier A1 is smaller than the very small change in the positive direction which is added to the inverting input terminal (−), the output signal S2 does not exceed the reference voltage V1 but is slowly returned to an original state.

To the contrary, if a sufficient change in the negative direction is input to the inverting input terminal (−) of the operational amplifier A1, the electric potential of the inverting input terminal (−) of the operational amplifier A1 is lower than the equivalent threshold voltage VT and the output signal S2 is higher than the predetermined voltage. Consequently, the input/output stabilizing circuit B13 carries out a transition of the threshold voltage VT of the operational amplifier A1 into a high state and the very small change in the negative direction is added to the change in the signal input to the inverting input terminal (−). Therefore, the output signal S2 of the operational amplifier A1 is inverted quickly so that a negative feedback is applied through the diode D1.

By the operation, the output signal of the operational amplifier A1 is higher than the predetermined voltage immediately before a changing point Y where the amplitude of the high frequency signal output from the interrogator T4 is increased. Therefore, a very small change in the negative direction is added to the inverting input terminal (−). At the changing point Y where the amplitude of the high frequency signal output from the interrogator T4 is increased, accordingly, an inverting operation can be carried out for a larger change in the positive direction than the very small change in the negative direction which is added to the inverting input terminal (−).

Furthermore, the output voltage level of the operational amplifier A1 is sufficiently higher than the predetermined voltage. Therefore, the equivalent threshold voltage VT of the operational amplifier A1 is maintained to be high by the input/output stabilizing circuit B13. Therefore, the output signal S2 of the operational amplifier A1 is started to be changed slowly with respect to the change in the negative direction of the inverting input terminal (−) after the changing point Y.

If the change in the positive direction which is input to the inverting input terminal (−) of the operational amplifier A1 is smaller than the very small change in the negative direction which is added to the inverting input terminal (−), the output signal S2 is not lower than the reference voltage V1 but is slowly returned to the original state.

To the contrary, if a sufficient change in the positive direction is input to the inverting input terminal (−) of the operational amplifier A1, the electric potential of the inverting input terminal (−) of the operational amplifier A1 is higher than the equivalent threshold voltage VT and the output signal S2 is lower than the predetermined voltage. Consequently, the input/output stabilizing circuit B13 carries out a transition of the threshold voltage VT of the operational amplifier A1 into a low state and the very small change in the positive direction is added to the change in the signal input to the inverting input terminal (−). Therefore, the output signal S2 of the operational amplifier A1 is inverted quickly so that the negative feedback is applied through the diode D2.

By repeating the operation, it is possible to amplify the change in the amplitude of the high frequency signal output from the interrogator T4. By adding the very small change in the signal to the change in the signal input to the inverting input terminal (−), furthermore, it is possible to always maintain a state in which a micro current flows to either of the diodes constituting the feedback path B11. Thus, it is possible to stabilize the inverting input terminal (−) and the output signal S2 without amplifying a signal having a small noise.

As shown in FIG. 3, finally, it is possible to input the stabilized output signal S2 to the binarize circuit B12, thereby obtaining an output signal S3 by binarizing the change in the amplitude output from the interrogator with high precision.

In consideration of the influence on a jitter of demodulation data by the change in the output of the operational amplifier A1 at start of the change in the amplitude between the antenna terminals LA and LB, it is preferable that the reference voltage of the binarize circuit B12 should be equivalent to a voltage input to the non-inverting input terminal (+) of the operational amplifier A1.

By the operation, also in the case in which data are not transmitted from the interrogator T4 for a long period of time, the operational amplifier A1 is controlled into a state in which an inversion is hard to perform with a micro signal representing the noise by the operation of the input/output stabilizing circuit B13. Therefore, a great change can be prevented from being generated on the output signal S2 of the operational amplifier A1 due to a noise. Subsequently, it is possible to normally demodulate the data transmitted by the interrogator T4.

Figure 5:
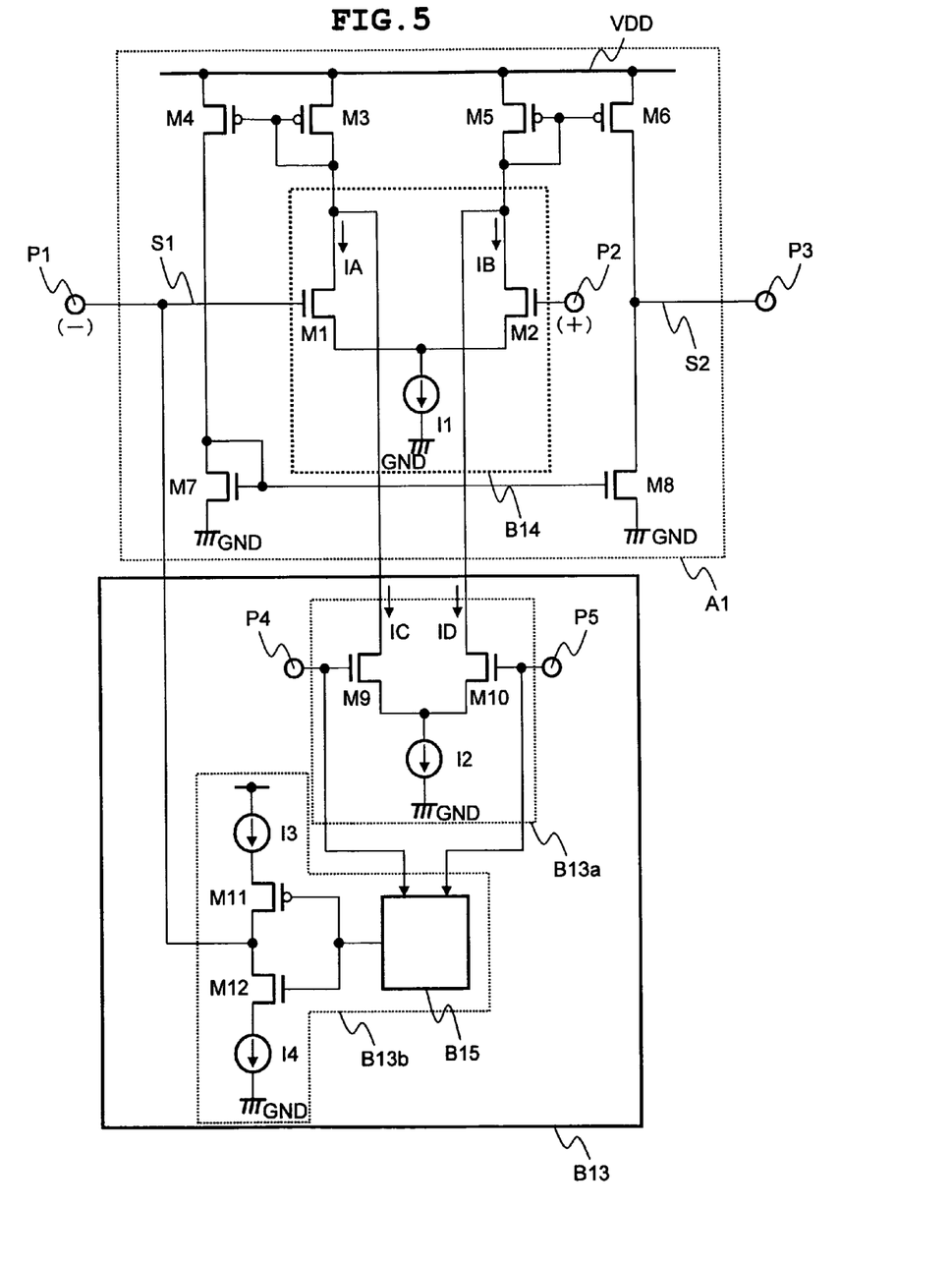
FIG. 5 is a circuit diagram showing an example of structures of an operational amplifier and an input/output stabilizing circuit which are included in the receiver circuit.

FIG. 5 shows an example of structures of the operational amplifier A1 and the input/output stabilizing circuit B13.

The operational amplifier A1 has a differential input circuit B14 constituted by two MOS transistors M1 and M2 having source terminals connected to each other and a current source I1, and a gate terminal P1 of the MOS transistor M1 serves as the inverting input terminal of the operational amplifier A1 and a gate terminal P2 of the MOS transistor M2 serves as the non-inverting input terminal of the operational amplifier Al. The MOS transistors M1 and M2 are set to have an n-channel type.

Referring to two current signals IA and IB output from the differential input circuit B14, a change in the current is converted into a change in a voltage and is amplified by an amplifier constituted by MOS transistors M3 to M8 to obtain the output signal S2 from the output terminal P3. The MOS transistors M3 to M6 are set to have a p-channel type and the MOS transistor M7 and M8 are set to have the n-channel type. A current mirror circuit is formed by the MOS transistors M3 and M4, a current mirror circuit is formed by the MOS transistors M5 and M6, and a current mirror circuit is formed by the MOS transistors M7 and M8.

The input/output stabilizing circuit B13 has a threshold voltage control circuit B13a for changing the threshold voltage VT of the operational amplifier A1 in response to the output signal S2 of the operational amplifier A1 and an input signal adding circuit B13b for adding a micro signal to the signal input to the inverting input terminal (−) of the operational amplifier A1 in response to the output signal S2 of the operational amplifier A1.

The threshold voltage control circuit B13a is constituted by two MOS transistors M9 and M10 having source terminals connected to each other and a current source I2, and has the function of adding output currents IC and ID changed corresponding to a relationship between magnitudes of input signals sent from input terminals P4 and P5 to the output currents IA and IB of the differential input circuit B14. M9 and M10 are set to have the n-channel type.

It is suitable that the reference voltage V1 input to the non-inverting input terminal of the operational amplifier A1 should be input to the gate terminal P4 of the MOS transistor M9 and the output signal S2 of the operational amplifier A1 should be input to the gate terminal P5 of the MOS transistor M10, which is not particularly restricted.

Description will be given to the case in which the reference voltage V1 is input to the gate terminal P4 and the output signal S2 is input to the gate terminal P5.

In the case in which the input/output stabilizing circuit B13 is not provided, usually, the operational amplifier A1 is operated by setting the reference voltage V1 to be the threshold voltage VT. In the case in which the output currents IC and ID changed corresponding to the relationship between the magnitudes of the output signal S2 and the reference voltage V1 are added to the output currents IA and IB of the differential input circuit B14 and the output signal S2 is thus higher than the reference voltage V1 as described above, however, a current flowing to the MOS transistor M5 is larger than a current flowing to the MOS transistor M3. Consequently, the operational amplifier A1 is operated to easily maintain the output signal to have a high electric potential and acts as if the threshold voltage VT is raised.

To the contrary, if the output signal S2 is lower than the reference voltage V1, the current flowing to the MOS transistor M5 is smaller than the current flowing to the MOS transistor M3. Consequently, the operational amplifier A1 is operated to easily maintain the output signal to have a low electric potential and acts as if the threshold voltage VT is dropped.

By adding the threshold voltage control circuit B13a, accordingly, it is possible to change the threshold voltage of the operational amplifier A1 corresponding to the relationship between the magnitudes of the output signal S2 and the reference voltage V1.

A variation in the threshold of the operational amplifier A1 is determined by a ratio of the output currents IA and IB of the differential input circuit B14 to the output currents IC and ID of the threshold voltage control circuit B13a. In other words, the variation in the threshold of the operational amplifier A1 is determined by a ratio of the current sources I1 and I2. By regulating the current values of the current sources I2, therefore, it is possible to regulate the variation in the threshold voltage. By utilizing the regulation, it is also possible to cause the current source I2 to have a current value regulating function if necessary.

While the output currents IC and ID of the threshold voltage control circuit B13a are caused to flow to the MOS transistors M3 and M5 to vary the threshold voltage of the operational amplifier A1, moreover, it is not particularly restricted. For example, in case of the operational amplifier A1 shown in FIG. 5, the same advantage can be obtained even if the output current IC is caused to flow to the MOS transistor M6 and the output current ID is caused to flow to the MOS transistor M4. In some cases, it is also necessary to regulate the current source I2 in consideration of the sizes of the MOS transistors M3 to M6.

On the other hand, the input signal adding circuit B13b is constituted by very small current sources I3 and I4, MOS transistors M11 and M12, and a binarize circuit B15. If the output signal S2 is higher than the reference voltage V1, the MOS transistor M11 is turned off and the MOS transistor M12 is turned on so that a micro current is extracted from the inverting input terminal (−). If the output signal S2 is lower than the reference voltage V1 of the binarize circuit B15, the MOS transistor M11 is turned on and the MOS transistor M12 is turned off so that a micro current is caused to flow from the inverting input terminal (−).

If the output signal S2 is higher than the reference voltage V1, consequently, a very small change in a positive direction is added to a change in a signal input to the inverting input terminal (−). If the output signal S2 is lower than the reference voltage V1, a very small change in a negative direction is added to the change in the signal input to the inverting input terminal (−).

According to the example, it is possible to obtain the following functions and advantages.

If the output signal S2 is higher than the reference voltage V1, a very small change in a positive direction is added to the change in the signal input to the inverting input terminal (−). If the output signal S2 is lower than the reference voltage V1, a very small change in a negative direction is added to the change in the signal input to the inverting input terminal (−). Also in the case in which the data are not transmitted from the interrogator T4 for a long period of time, consequently, the operational amplifier A1 is controlled into a state in which an inversion is hard to perform with a micro signal representing a noise by the threshold voltage control circuit B13a. Moreover, a very small variation caused by a noise generated on the inverting input terminal (−) of the operational amplifier A1 is absorbed by the input signal adding circuit B13b. Therefore, a great change can be prevented from being generated over the output signal S2 of the operational amplifier A1 due to the noise. Thus, it is possible to normally demodulate the data transmitted subsequently by the interrogator T4.

Figure 6:
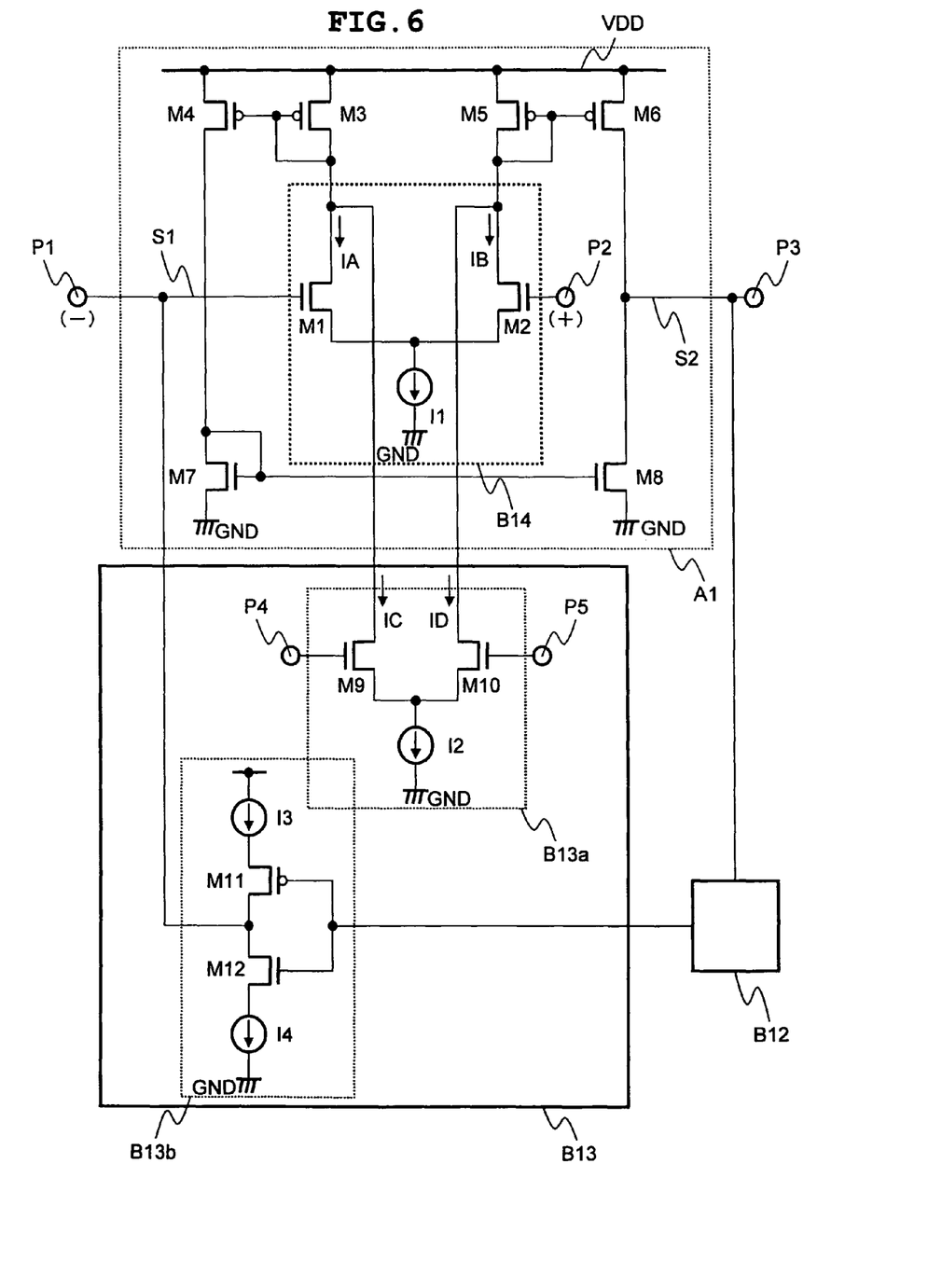
FIG. 6 is a circuit diagram showing another example of the structure of the input/output stabilizing circuit.

FIG. 6 shows another example of the structure of the input/output stabilizing circuit B13.

The input/output stabilizing circuit B13 shown in FIG. 6 is greatly different from that shown in FIG. 5 in that the binarize circuit B15 in the input/output stabilizing circuit B13 is omitted. In other words, the binarize circuit B15 in the input/output stabilizing circuit B13 is omitted and an output signal of a binarize circuit B12 disposed in a subsequent stage of the operational amplifier A1 is transmitted into the input/output stabilizing circuit B13. Thus, it is possible to obtain the same functions and advantages as those shown in FIG. 5. Moreover, the input/output stabilizing circuit B13 does not need to have an inherent binarize circuit. Therefore, it is possible to reduce a chip area of a whole receiver circuit, thereby implementing a reduction in a consumption power.

Figure 7:
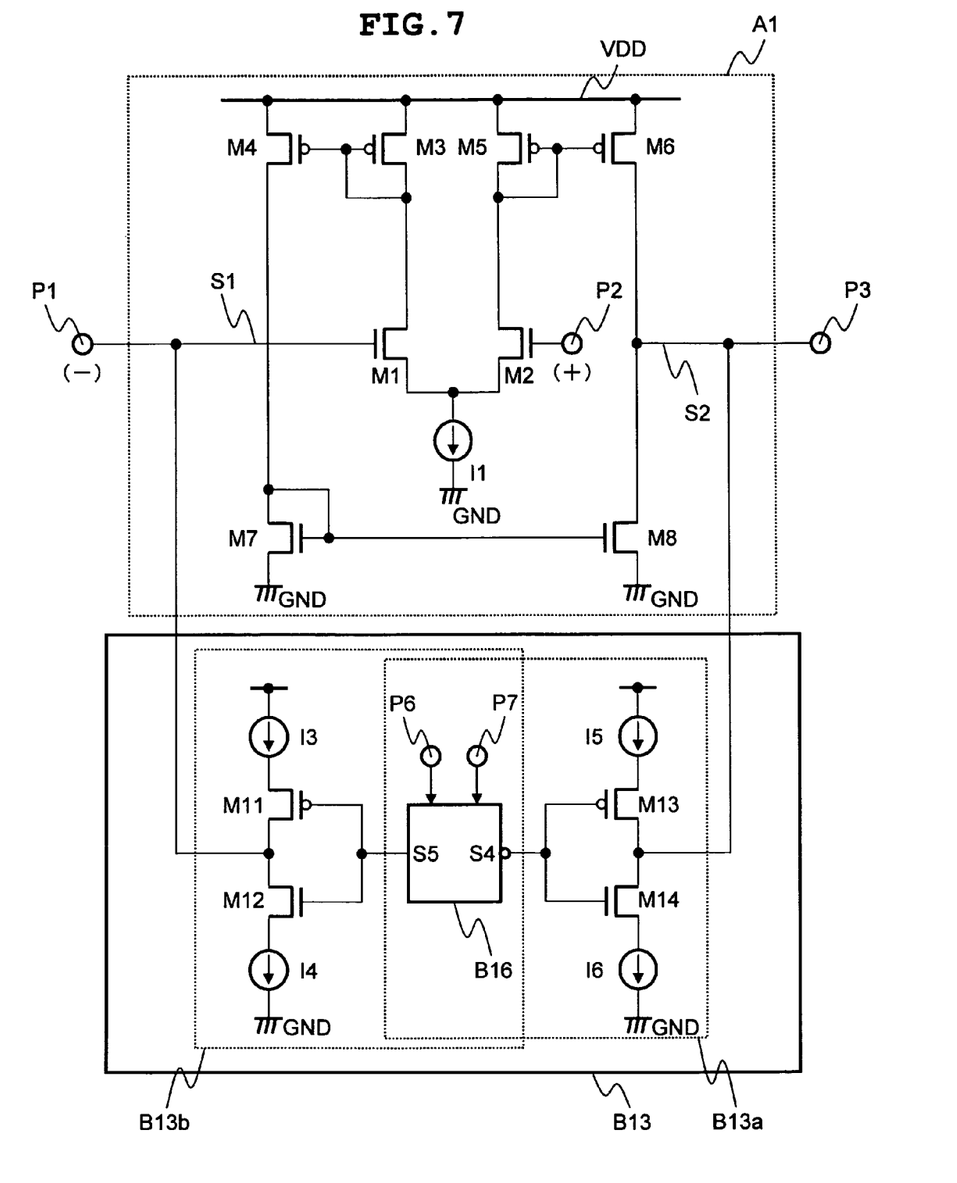
FIG. 7 is a circuit diagram showing a further example of the structure of the input/output stabilizing circuit.

FIG. 7 shows a further example of the structure of the input/output stabilizing circuit B13.

The input/output stabilizing circuit B13 shown in FIG. 7 has a threshold voltage control circuit B13a for changing a threshold voltage VT of an operational amplifier A1 in response to a signal output from an operational amplifier A1 and an input signal adding circuit B13b for adding a micro signal to a signal input to an inverting input terminal (−) of the operational amplifier A1 in response to the signal output from the operational amplifier A1.

The threshold voltage control circuit B13a is constituted by current sources I5 and I6, MOS transistors M13 and M14, and a binarize circuit B16. The MOS transistor M13 is set to have a p-channel type and the MOS transistor M14 is set to have an n-channel type. The binarize circuit B16 compares signals sent to input terminals P6 and P7 and outputs control signals S4 and S5 determined corresponding to a relationship between magnitudes thereof. An output signal S2 of the operational amplifier A1 is transmitted to the input terminal P6 and a reference voltage V1 is transmitted to the input terminal P7.

If the output signal S2 of the operational amplifier A1 is higher than the reference voltage V1, the MOS transistor M13 is turned on and the MOS transistor M14 is turned off in response to the control signal S4. The operational amplifier A1 is operated to easily maintain the output signal S2 to have a high electric potential and acts as if the threshold voltage VT is raised.

To the contrary, if the output signal S2 of the operational amplifier A1 is lower than the reference voltage V1, the MOS transistor M13 is turned off and the MOS transistor M14 is turned on in response to the control signal S4. Consequently, the operational amplifier A1 is operated to easily maintain the output signal S2 to have a low electric potential and acts as if the threshold voltage VT is dropped.

This indicates that the threshold voltage VT of the operational amplifier A1 can be changed corresponding to a relationship between magnitudes of the output signal S2 and the reference voltage V1.

On the other hand, the input signal adding circuit B13b is constituted in the same manner as the input signal adding circuit B13*b* shown in FIG. 5, and a binarize circuit is shared with the binarize circuit B16 of the threshold voltage control circuit B13*a*. The control signals S4 and S5 are logically inverted.

If the output signal S2 is higher than the reference voltage V1, the MOS transistor M11 is turned off and the MOS transistor M12 is turned on so that a micro current is extracted from the inverting input terminal (−). If the output signal S2 is lower than the reference voltage V1, the MOS transistor M11 is turned on and the MOS transistor M12 is turned off so that the micro current is caused to flow from the inverting input terminal (−).

Consequently, a very small change in a positive direction can be added to the change in the signal input to the inverting input terminal (−) of the operational amplifier A1 if the output signal S2 is higher than the reference voltage V1, and a very small change in a negative direction can be added to the change in the signal input to the inverting input terminal (−) of the operational amplifier A1 if the output signal S2 is lower than the reference voltage V1.

Also in the case in which data are not transmitted from the interrogator T4 for a long period of time by the operation, the operational amplifier A1 is controlled into a state in which an inversion is hard to perform with a micro signal representing a noise by the threshold voltage control circuit B13*a* and a very small variation caused by a noise generated on the inverting input terminal (−) of the operational amplifier A1 is absorbed by the input signal adding circuit B13*b*. Therefore, a great change can be prevented from being generated over the output signal S2 of the operational amplifier A1 due to the noise, and the data transmitted subsequently from the interrogator T4 can be demodulated normally. Moreover, it is possible to set the current sources I5 and I6 constituting the threshold voltage control circuit B13*a* to have independent current values, respectively. Consequently, it is possible to change a variation in a threshold in the case in which the threshold voltage VT of the operational amplifier A1 is controlled to be high and the case in which it is controlled to be low. By utilizing the change, for example, it is also possible to reduce a threshold voltage error of the operational amplifier A1 which is generated due to a relative manufacturing error made in the MOS transistors M3 to M8 by individually regulating the current values of the current sources I5 and I6 stored in a memory to be loaded into the contactless IC card B1.

Figure 8:
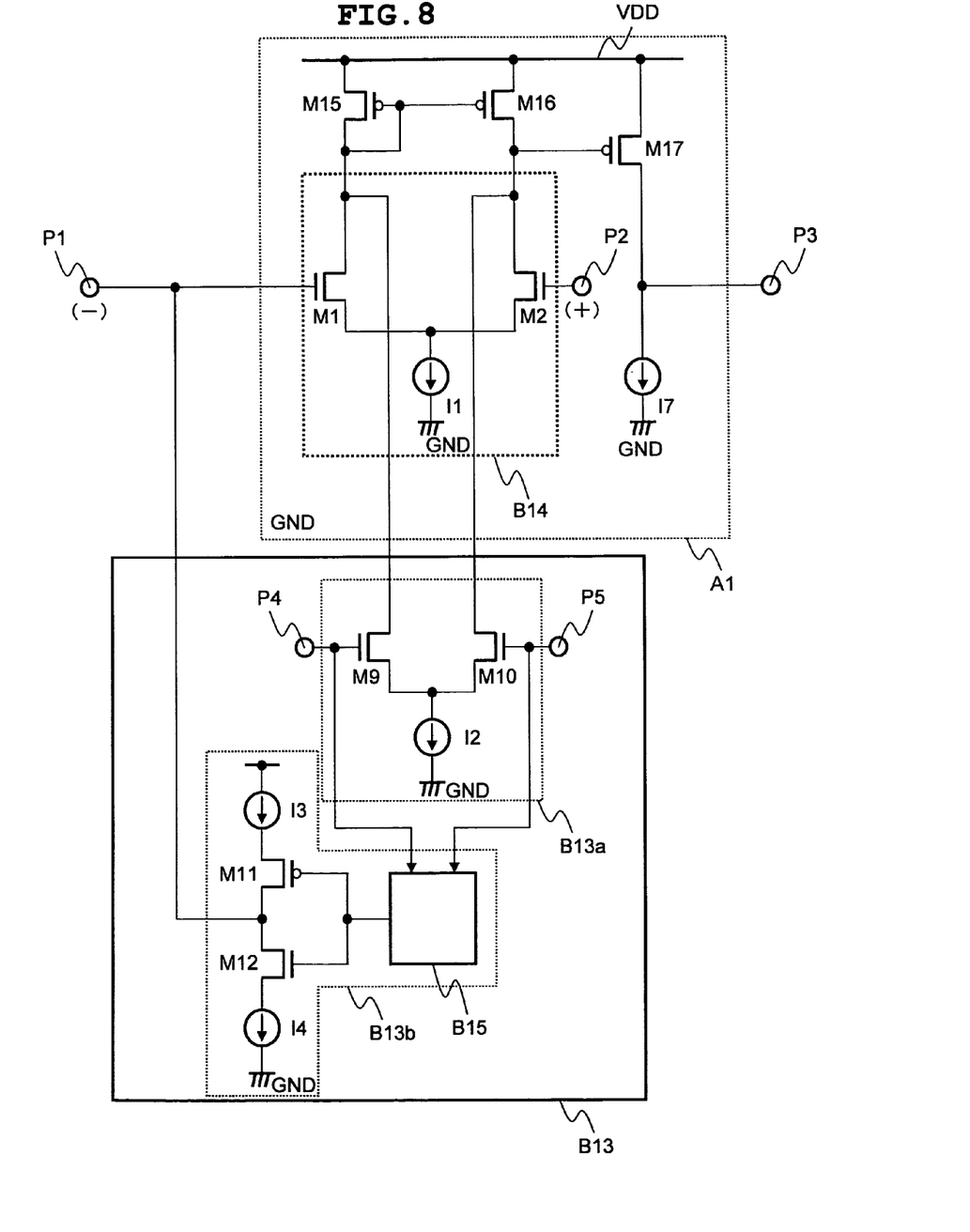
FIG. 8 is a circuit diagram showing another example of the structure of the operational amplifier.

FIG. 8 shows another example of the structure of the operational amplifier A1 in the receiver circuit to be loaded into the semiconductor integrated circuit device and the contactless IC card according to the invention. The operational amplifier shown in FIG. 8 is greatly different from that shown in FIG. 5 in that an amplifier portion of an operational amplifier A1 is constituted by MOS transistors M15 to M17 and a current source I7. A signal output from the operational amplifier A1 is sent through the MOS transistor M17. The MOS transistors M15 to M17 are set to have a p-channel type.

According to the structure shown in FIG. 8, it is possible to obtain a higher gain than that of the operational amplifier A1 shown in FIG. 5. Therefore, a small noise is generated on an inverting input terminal (−) of the operational amplifier A1 and it is possible to receive a signal amplitude of data transmitted from a smaller interrogator.

Figure 9:
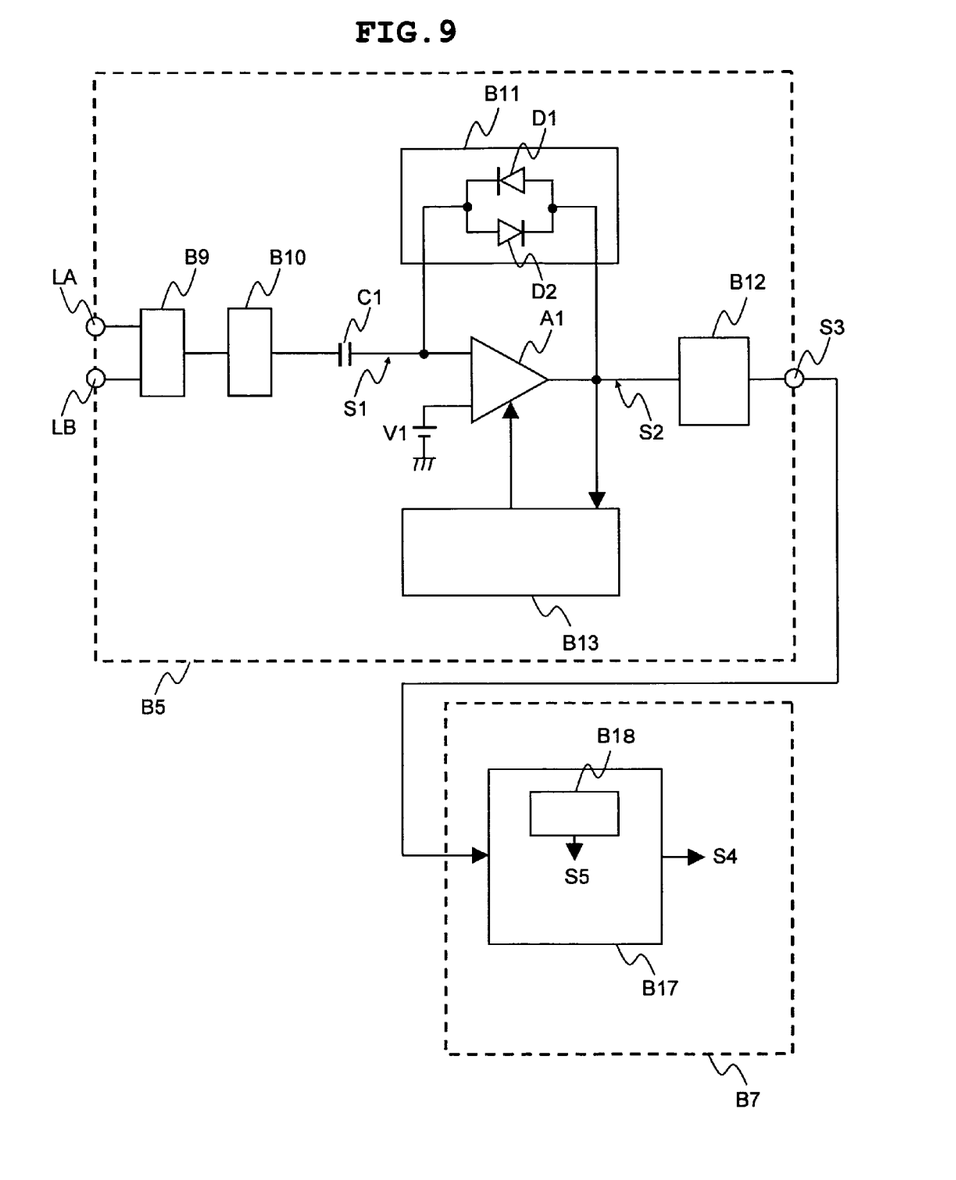
FIG. 9 is a detailed diagram showing a receiver circuit and a control circuit.

FIG. 9 shows the details of a receiver circuit B5 and a control circuit B7. The receiver circuit shown in FIG. 3 is applied to the receiver circuit B5. The control circuit B7 is provided with a decoder circuit B17 which decodes data transmitted from the interrogator from an output signal S3 of the receiver circuit B5 and outputs down communication data S4.

Moreover, the decoder circuit B17 is provided with an encoding system detector circuit B18 for detecting an encoding system of the data transmitted from the interrogator, it is detected that the encoding system (ISO-18092) described in the Non-Patent Document 1 or the encoding system (ISO14443-B) described in the Non-Patent Document 2 is used, for example, and a detection signal S5 is output. The decoder circuit B17 can switch a decoding function thereof depending on the encoding system of the data transmitted from the interrogator by using the detection signal S5.

As described above, the receiver circuit shown in FIG. 3 is applied to the receiver circuit B5 and an enhancement in a noise resistance can be achieved by the input/output stabilizing circuit B13. Also in the case in which a state of a receiving standby is maintained for a long period of time, accordingly, the inverting input terminal (−) of the operational amplifier can be prevented from being brought into an unstable state. Thus, there is no problem that the SOF signal in the encoding system according to the Non-Patent Document 2 cannot be detected and the IC card cannot normally demodulate the down communication data. Also in the case in which the data are not transmitted from the interrogator for a long period of time, moreover, the operating noises of the other circuits loaded into the IC card or the noises caused by the external factor do not generate a great change in the output signal of the operational amplifier. Consequently, the output signal S3 of the receiver circuit B5 accurately reflects the signal transmitted from the interrogator.

According to the structure shown in FIG. 9, it is possible to easily decide the encoding system of the data transmitted from the interrogator. Consequently, the encoding system detecting function B13 can easily discriminate different communicating methods.

While the invention made by the inventor has been specifically described above based on the examples, the invention is not restricted to the examples but it is apparent that various changes can be made without departing from the scope thereof.

While the description has been given to the example in which the differential input circuit constituting the threshold voltage control circuit B13*a* is constituted by the n-channel type MOS transistor, it may be constituted by a p-channel type MOS transistor. In the contactless IC card B1 shown in FIG. 4, moreover, it is also possible to form the power circuit B3, the receiver circuit B5, the transmitter circuit B6, the control circuit B7 and the memory B8 by separate chips, respectively.

The invention can be widely applied to a semiconductor integrated circuit device or a contactless electronic device which rectifies and smoothes an AC voltage, thereby forming an internal voltage.

What is claimed is:

1. A semiconductor integrated circuit device comprising:
   an operational amplifier having an inverting input terminal, a non-inverting input terminal and an output terminal;
   a capacitor that transmits an input signal to the inverting input terminal of the operational amplifier;
   a feedback path provided between an output terminal and the inverting input terminal in the operation amplifier; and
   an input/output stabilizing circuit,
   wherein a reference voltage is supplied to the non-inverting input terminal of the operational amplifier, and
   wherein the input/output stabilizing circuit changes a threshold voltage of the operational amplifier and adds a micro signal input to the inverting input terminal of the operational amplifier, thereby carrying out an input/output stabilizing control in response to a signal output from the operational amplifier.

2. The semiconductor integrated circuit device according to claim 1, wherein the operational amplifier includes a first MOS transistor and a second MOS transistor which is differentially connected to the first MOS transistor, and the inverting input terminal is led out of a gate terminal of the first MOS transistor and the non-inverting input terminal is led out of a gate terminal of the second MOS transistor.

3. The semiconductor integrated circuit device according to claim 1,
wherein the input/output stabilizing circuit includes:
a binarize circuit for comparing the output voltage of the operational amplifier with the reference voltage, thereby carrying out a binarization;
a threshold voltage control circuit that controls the threshold voltage of the operational amplifier by connecting a seventh MOS transistor connected to a third current source to an eighth MOS transistor connected to a fourth current source in series and selectively conducting the seventh MOS transistor to the eighth MOS transistor in response to a signal output from the binarize circuit; and
a signal supplying circuit that supplies a micro signal to be added to a signal input to the inverting input terminal of the operational amplifier by connecting a ninth MOS transistor connected to a fifth current source to a tenth MOS transistor connected to a sixth current source in series and selectively conducting the ninth MOS transistor to the tenth MOS transistor in response to a signal output from the binarize circuit.

4. The semiconductor integrated circuit device according to claim 1,
wherein the semiconductor integrated circuit device is loaded into an IC card and configured so as to carry out a processing of receiving a signal output from an interrogator.

5. The semiconductor integrated circuit device according to claim 1, further comprising:
a binarize circuit for comparing the signal output from the operational amplifier with the reference voltage, thereby carrying out a binarization; and
an encoding system detecting circuit for detecting an encoding system of the output signal thus binarized.

6. An IC card having the semiconductor integrated circuit device according to claim 1, wherein the semiconductor integrated circuit device has a binarize circuit for comparing the signal output from the operational amplifier with the reference voltage, thereby carrying out a binarization, and an encoding system detecting circuit for detecting an encoding system of the output signal thus binarized.

7. A semiconductor integrated circuit device comprising:
an operational amplifier having an inverting input terminal, a non-inverting input terminal and an output terminal;
a capacitor that transmits an input signal to the inverting input terminal of the operational amplifier;
a feedback path provided between an output terminal and the inverting input terminal in the operational amplifier;
a reference voltage being supplied to the non-inverting input terminal of the operational amplifier;
a threshold voltage control circuit that controls a threshold voltage of the operational amplifier; and
an input signal adding circuit for adding an input signal from the inverting input terminal of the operational amplifier,
wherein, when an output voltage of the operational amplifier is lower than the reference voltage, the threshold voltage of the operational amplifier is dropped by the threshold voltage control circuit and a change in a signal in a positive direction is added to a change in the signal input to the inverting input terminal of the operational amplifier by the input signal adding circuit, and
wherein, when the output voltage of the operational amplifier is higher than the reference voltage, the threshold voltage of the operational amplifier is raised by the threshold voltage control circuit and a change in a signal in a negative direction is added to the change in the signal input to the inverting input terminal of the operational amplifier by the input signal adding circuit.

8. The semiconductor integrated circuit device according to claim 7,
wherein the operational amplifier includes a first MOS transistor and a second MOS transistor which is differentially connected to the first MOS transistor, and the inverting input terminal is led out of a gate terminal of the first MOS transistor and the non-inverting input terminal is led out of a gate terminal of the second MOS transistor.

9. The semiconductor integrated circuit device according to claim 8, wherein the threshold voltage control circuit includes a third MOS transistor and a fourth MOS transistor which is differentially connected to the third MOS transistor,
wherein the reference voltage is transmitted to a gate terminal of the third MOS transistor,
wherein an output voltage of the operational amplifier is transmitted to a gate terminal of the fourth MOS transistor,
wherein a drain terminal of the third MOS transistor is connected to that of the first MOS transistor, and
wherein a drain terminal of the fourth MOS transistor is connected to that of the second MOS transistor.

10. The semiconductor integrated circuit device according to claim 9,
wherein the input signal adding circuit includes:
a binarize circuit for comparing the output voltage of the operational amplifier with the reference voltage, thereby carrying out a binarization; and
a signal supplying circuit that supplies a micro signal to be added to a signal input to the inverting input terminal of the operational amplifier by connecting a fifth MOS transistor connected to a first current source to a six MOS transistor connected to a second current source in series and selectively conducting the fifth MOS transistor to the sixth MOS transistor in response to a signal output from the binarize circuit.

11. The semiconductor integrated circuit device according to claim 9,
wherein, when a binarize circuit for binarizing a signal output from the operational amplifier is disposed in a subsequent stage of the operational amplifier, the input signal adding circuit is constituted to include a signal supplying circuit that supplies a micro signal to be added to a signal input to the inverting input terminal of the operational amplifier by connecting a fifth MOS transistor connected to a first current source to a six MOS transistor connected to a second current source in series and selectively conducting the fifth MOS transistor to the sixth MOS transistor in response to a signal output from the binarize circuit disposed in the subsequent stage of the operational amplifier.

* * * * *